United States Patent
Campbell et al.

(10) Patent No.: US 9,332,674 B2
(45) Date of Patent: May 3, 2016

(54) FIELD-REPLACEABLE BANK OF IMMERSION-COOLED ELECTRONIC COMPONENTS

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 290 days.

(21) Appl. No.: 14/058,581

(22) Filed: Oct. 21, 2013

(65) Prior Publication Data

US 2015/0109728 A1    Apr. 23, 2015

(51) Int. Cl.
*H05K 7/20* (2006.01)
*G06F 1/20* (2006.01)

(52) U.S. Cl.
CPC ............ *H05K 7/203* (2013.01); *H05K 7/20236* (2013.01); *H05K 7/20336* (2013.01); *H05K 7/20781* (2013.01); *H05K 2007/20527* (2013.01)

(58) Field of Classification Search
CPC .............. H05K 7/203; H05K 7/20309; H05K 7/20781; H05K 7/20763; H05K 7/20236; H05K 7/20218; H05K 5/00; H01L 23/44; G06F 1/20; G06F 1/206

USPC ....................... 361/679.46–679.54, 688, 689, 361/698–702, 715–727; 165/80.2–80.5, 165/104.19, 104.26, 104.33, 185; 62/259.2, 62/259.3, 457.2, 457.9, 3, 7; 174/15.1, 174/15.2, 16.3, 520; 312/223.2, 223.3, 236, 312/265

See application file for complete search history.

(56) References Cited

U.S. PATENT DOCUMENTS 3,417,814 A    12/1968    Oktay
3,512,582 A    5/1970    Chu et al.
(Continued)

FOREIGN PATENT DOCUMENTS

JP    02114597 A1    4/1990
JP    406061673 A1    3/1994

OTHER PUBLICATIONS

Council et al., "Temperature Controlled Immersed Cooling System", IBM Technical Disclosure Bulletin, IPCOM000090118D, ePublished Mar. 5, 2005; TDB02-69, p. 1097-1098 (Feb. 1, 1969).
(Continued)

*Primary Examiner* — Michail V Datskovskiy
(74) *Attorney, Agent, or Firm* — Steven Chiu, Esq.; Kevin P. Radigan, Esq; Heslin Rothenberg Farley & Mesiti P.C.

(57) ABSTRACT

A cooled electronic system and cooling method are provided, wherein a field-replaceable bank of electronic components is cooled by an apparatus which includes an enclosure at least partially surrounding and forming a compartment about the electronic components, a fluid disposed within the compartment, and a heat sink associated with the enclosure. The field-replaceable bank extends, in part, through the enclosure to facilitate operative docking of the electronic components into one or more respective receiving sockets of the electronic system. The electronic components of the field-replaceable bank are, at least partially, immersed within the fluid to facilitate immersion-cooling of the components, and the heat sink facilitates rejection of heat from the fluid disposed within the compartment. In one embodiment, multiple thermal conductors project from an inner surface of the enclosure into the compartment to facilitate transfer of heat from the fluid to the heat sink.

17 Claims, 14 Drawing Sheets

(56) References Cited

U.S. PATENT DOCUMENTS

| | | | |
|---|---|---|---|
| 3,741,292 A * | 6/1973 | Aakalu | H01L 23/427 165/104.21 |
| 3,851,221 A * | 11/1974 | Beaulieu | H01L 23/44 257/714 |
| 3,858,090 A | 12/1974 | Lehmann | |
| 4,312,012 A * | 1/1982 | Frieser | H01L 21/3046 165/133 |
| 4,590,538 A * | 5/1986 | Cray, Jr. | H05K 7/20236 361/700 |
| 4,619,316 A | 10/1986 | Nakayama et al. | |
| 4,704,658 A | 11/1987 | Yokouchi et al. | |
| 4,970,868 A | 11/1990 | Grebe et al. | |
| 5,023,695 A | 6/1991 | Umezawa et al. | |
| 5,245,508 A | 9/1993 | Mizzi | |
| 5,720,338 A | 2/1998 | Larson et al. | |
| 6,019,167 A | 2/2000 | Bishop et al. | |
| 6,055,157 A | 4/2000 | Bartilson | |
| 6,111,749 A | 8/2000 | Lamb et al. | |
| 7,184,269 B2 | 2/2007 | Campbell et al. | |
| 7,365,982 B2 | 4/2008 | He | |
| 7,403,392 B2 | 7/2008 | Attlesey et al. | |
| 7,414,845 B2 | 8/2008 | Attlesey et al. | |
| 7,477,513 B1 | 1/2009 | Cader et al. | |
| 7,905,106 B2 | 3/2011 | Attlesey | |
| 7,936,560 B2 | 5/2011 | Toyoda et al. | |
| 7,983,040 B2 | 7/2011 | Campbell et al. | |
| 8,014,150 B2 | 9/2011 | Campbell et al. | |
| 8,094,454 B2 | 1/2012 | Lowry | |
| 8,305,759 B2 | 11/2012 | Attlesey et al. | |
| 8,699,225 B2 | 4/2014 | Brandenburg et al. | |
| 2007/0034360 A1 | 2/2007 | Hall | |
| 2007/0290311 A1 | 12/2007 | Hauenstein | |
| 2007/0297136 A1 | 12/2007 | Konshak | |
| 2008/0123297 A1 | 5/2008 | Tilton et al. | |
| 2009/0284924 A1 | 11/2009 | Konshak et al. | |
| 2011/0103019 A1 | 5/2011 | Campbell et al. | |
| 2011/0132579 A1 | 6/2011 | Best et al. | |
| 2011/0182033 A1 | 7/2011 | Tissot et al. | |
| 2012/0279233 A1 | 11/2012 | Chainer et al. | |
| 2012/0279686 A1 | 11/2012 | Chainer et al. | |
| 2012/0281358 A1 | 11/2012 | Chainer et al. | |
| 2013/0021752 A1 | 1/2013 | Campbell et al. | |
| 2015/0109729 A1 | 4/2015 | Campbell et al. | |

OTHER PUBLICATIONS

Anderson et al., "Hermetically Sealed, Field Removable Module Having an Integral Pump and Coolant Heat Exchanger for Forced Convection Immersion Cooling of Electronic Circuit Modules", IBM Technical Disclosure Bulletin, IPCOM000109890D, ePublished Mar. 24, 2005; TDB n4b 09-92, p. 443-444 (Sep. 1, 1992).

Scott, G.W., "Enclosure with Heat Exchanger for Immersion Cooling", IBM Technical Disclosure Bulletin, IPCOM000106417D, ePublished Mar. 21, 2005; TDB vol. 36, No. 11, p. 121-122 (Nov. 1, 1993).

Scott, G.W., "Conduction Cooled Enclosure for Immersion Cooling" IBM Technical Disclosure Bulletin, IPCOM000106449D, ePublished Mar. 21, 2005; TDB vol. 26, No. 11, p. 207-208 (Nov. 1, 1993).

Green et al., "High-Density Immersion Cooled-Electronic Module", IBM Technical Disclosure Bulletin, IPCOM000111152D, ePublished Mar. 26, 2005; TDB vol. 37, No. 2A, p. 393-394 (Feb. 1, 1994).

Anderson et al., "Liquid Immersion Cooling Scheme for Electronics Installed in an Open, Unsheltered Environment", IBM Technical Disclosure Bulletin, IPCOM000118180D, ePublished Apr. 1, 2005; TDB vol. 39, No. 10, 10-96, p. 161-162 (Oct. 1, 1996).

Anonymous, "Method for Localized Immersion Cooling" IBM Technical Disclosure Bulletin, IPCOM000008376D, ePublished Jun. 11, 2002.

Chu et al., "Advanced Cooling Technology for Leading-Edge Computer Products", Solid-State and Integrated Circuit Techology, 5th International Conference on IEEE Proceedings, pp. 559-562 (1998).

L. Campbell et al., "Immersion-Cooled and Conduction-Cooled Electronic System", U.S. Appl. No. 13/684,712, filed Nov. 26, 2012.

* cited by examiner

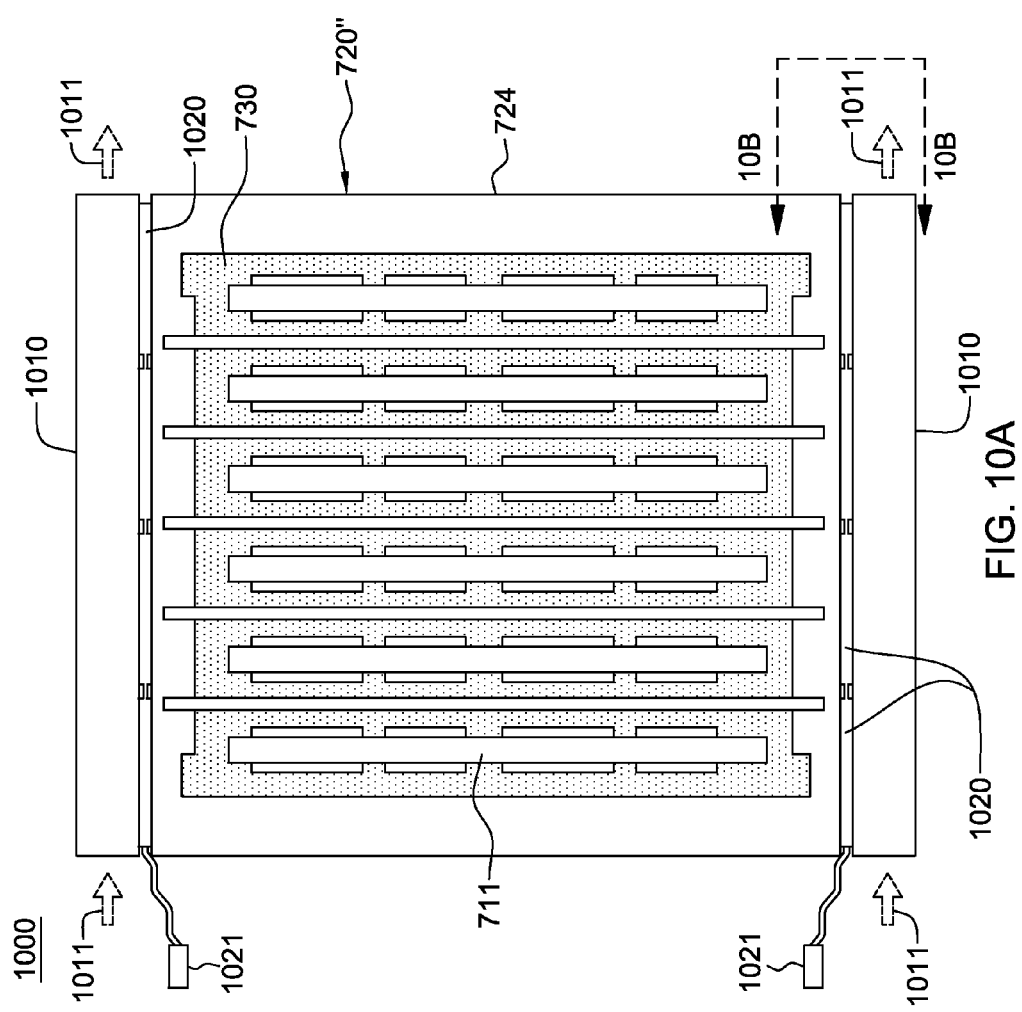
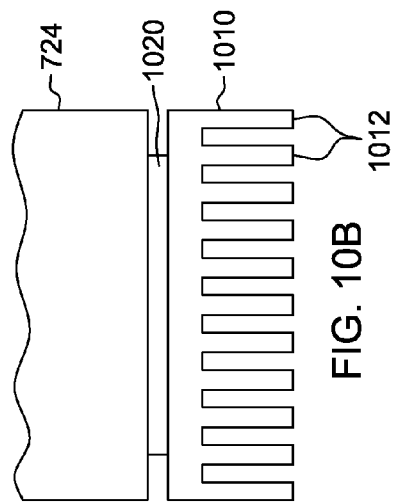
FIG. 10A
FIG. 10B

FIELD-REPLACEABLE BANK OF IMMERSION-COOLED ELECTRONIC COMPONENTS

BACKGROUND

As is known, operating electronic components produce heat. This heat should be removed in order to maintain device junction temperatures within desirable limits, with failure to remove heat effectively resulting in increased component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from electronic components with higher power density.

The need to cool current and future high heat load, high heat flux electronic devices therefore mandates the development of aggressive thermal management techniques using, for instance, liquid cooling.

BRIEF SUMMARY

The shortcomings of the prior art are overcome, and additional advantages are provided through the provision of a cooled electronic system which includes, for instance, an electronic system comprising a field-replaceable bank of electronic components, and a cooling apparatus facilitating cooling of the field-replaceable bank of electronic components. The cooling apparatus includes an enclosure at least partially surrounding and forming a compartment about, at least in part, the electronic components of the field-replaceable bank of electronic components, a fluid disposed within the compartment, and a heat sink attached to or integrated with the enclosure. The field-replaceable bank of electronic components extend, in part, through the enclosure to facilitate operative docking thereof into one or more respective receiving sockets of the electronic system. The electronic components of the field-replaceable bank of electronic components are, at least partially, immersed within the compartment in the fluid to facilitate immersion-cooling thereof, and the heat sink facilitates rejection of heat from the fluid disposed within the compartment.

In another aspect, a liquid-cooled electronics rack is provided which includes an electronics rack having at least one electronic system, the at least one electronic system including a field-replaceable bank of electronic components. A cooling apparatus is also provided which facilitates cooling of the field-replaceable bank of electronic components. The cooling apparatus includes an enclosure at least partially surrounding and forming a compartment about, at least in part, the electronic components of the field-replaceable bank of electronic components, a fluid disposed within the compartment, and a heat sink attached to or integrated with the compartment. The field-replaceable bank of electronic components extends, in part, through the enclosure to facilitate operative docking thereof into one or more respective receiving sockets of the at least one electronic system. The electronic components of the field-replaceable bank of electronic components are, at least partially, immersed within the compartment in the fluid to facilitate immersion-cooling thereof, and the heat sink facilitates rejection of heat from the fluid disposed within the compartment.

In a further aspect, a method of facilitating cooling of an electronic system is provided. The method includes: providing an electronic system comprising a field-replaceable bank of electronic components; and providing a cooling apparatus to facilitate cooling of the field-replaceable bank of electronic components, the cooling apparatus including an enclosure at least partially surrounding and forming a compartment about, at least in part, the electronic components of the field-replaceable bank of electronic components, a fluid disposed within the compartment, and a heat sink attached to or integrated with the enclosure. The field-replaceable bank of electronic components extend, in part, through the enclosure to facilitate operative docking thereof into one or more respective receiving sockets of the electronic system. The electronic components of the field-replaceable bank of electronic components are, at least partially, immersed within the compartment in the fluid to facilitate immersion-cooling thereof, and the heat sink facilitates rejection of heat from the fluid disposed within the compartment.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 10A is a top plan view of a still further cooled electronic system comprising a field-replaceable bank of electronic components of an electronic system, and a cooling apparatus therefor, in accordance with one or more aspects of the present invention;

FIG. 10B is a partial side elevational view of the cooled electronic system of FIG. 10A, taken along line 10B-10B thereof, in accordance with one or more aspects of the present invention.

DETAILED DESCRIPTION

Figure 1:
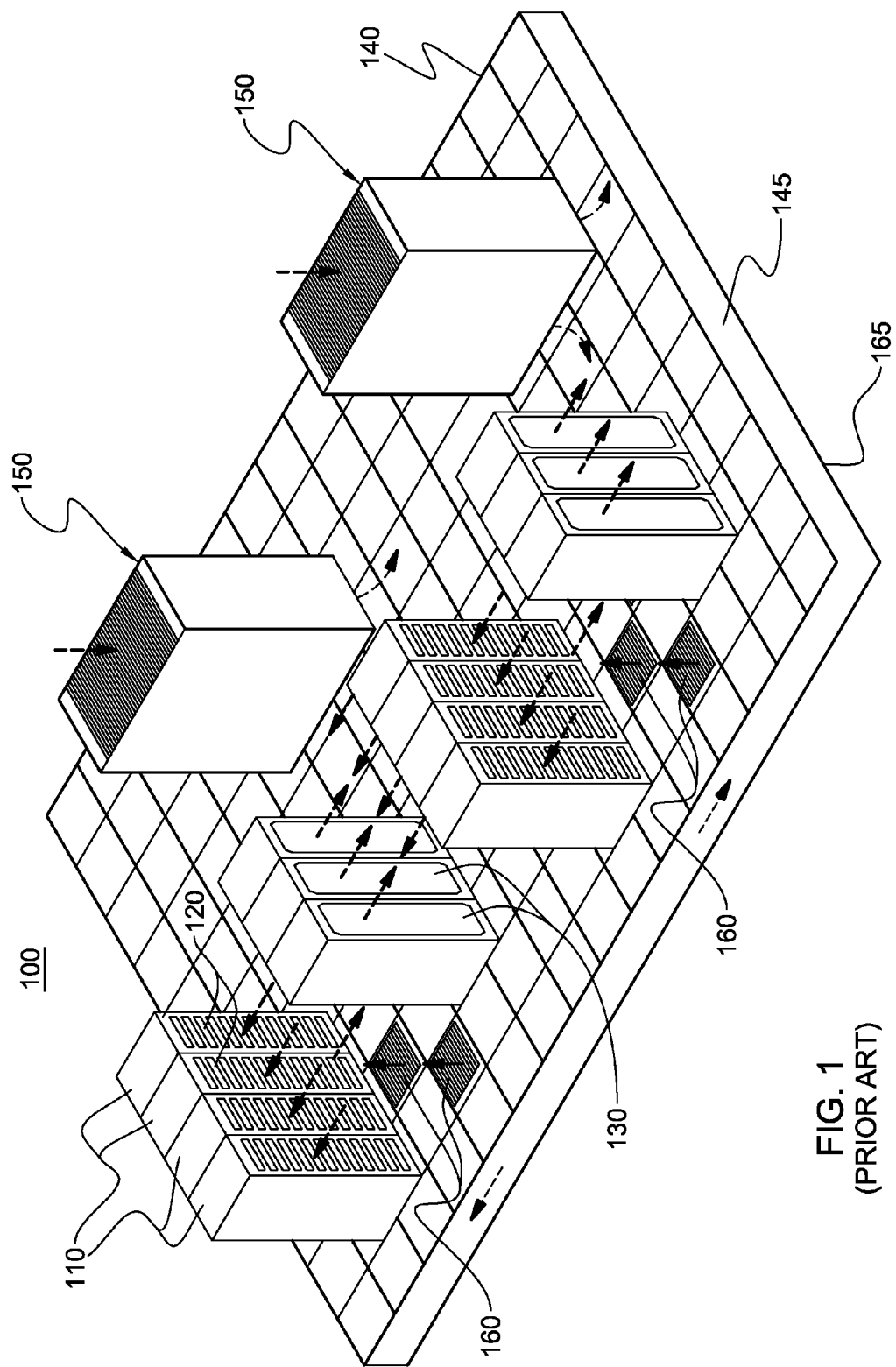
FIG. 1 depicts one embodiment of a conventional raised floor layout of an air-cooled computer installation.

As used herein, the terms "electronics rack", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", "liquid-cooled vapor condenser", "liquid-cooled heat sink", or "liquid-cooled thermal conductor" each refer to a thermally conductive structure having one or more channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

By way of further explanation, a "heat pipe" is a heat transfer device which combines the principles of both thermal conductivity and phase transition to effectively manage transfer of heat. A simple type of heat pipe includes a sealed case, an inner surface of which is covered with a layer of capillary or porous material, or structure comprising a wick which is saturated with the working fluid in its liquid phase. At a hot interface within the heat pipe, which may be at a low pressure, a working fluid within the heat pipe in contact with a thermally conductive surface (for example, an inner wall of the casing or a wick), turns into a vapor by absorbing heat from that surface. The working fluid vapor condenses back into a liquid at a cold interface of the heat pipe, releasing the latent heat. The working fluid liquid then returns to the hot interface through, for example, the wick structure by capillary action or gravity, where it evaporates once more and repeats the cycle. Internal pressure within the heat pipe can be set or adjusted to facilitate the phase change, depending on the demands of the working conditions of the cooling system.

One example of the coolants discussed herein, such as the facility coolant or system coolant, is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings, which are not drawn to scale to facilitate an understanding of the various aspects of the present invention, wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room.

Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
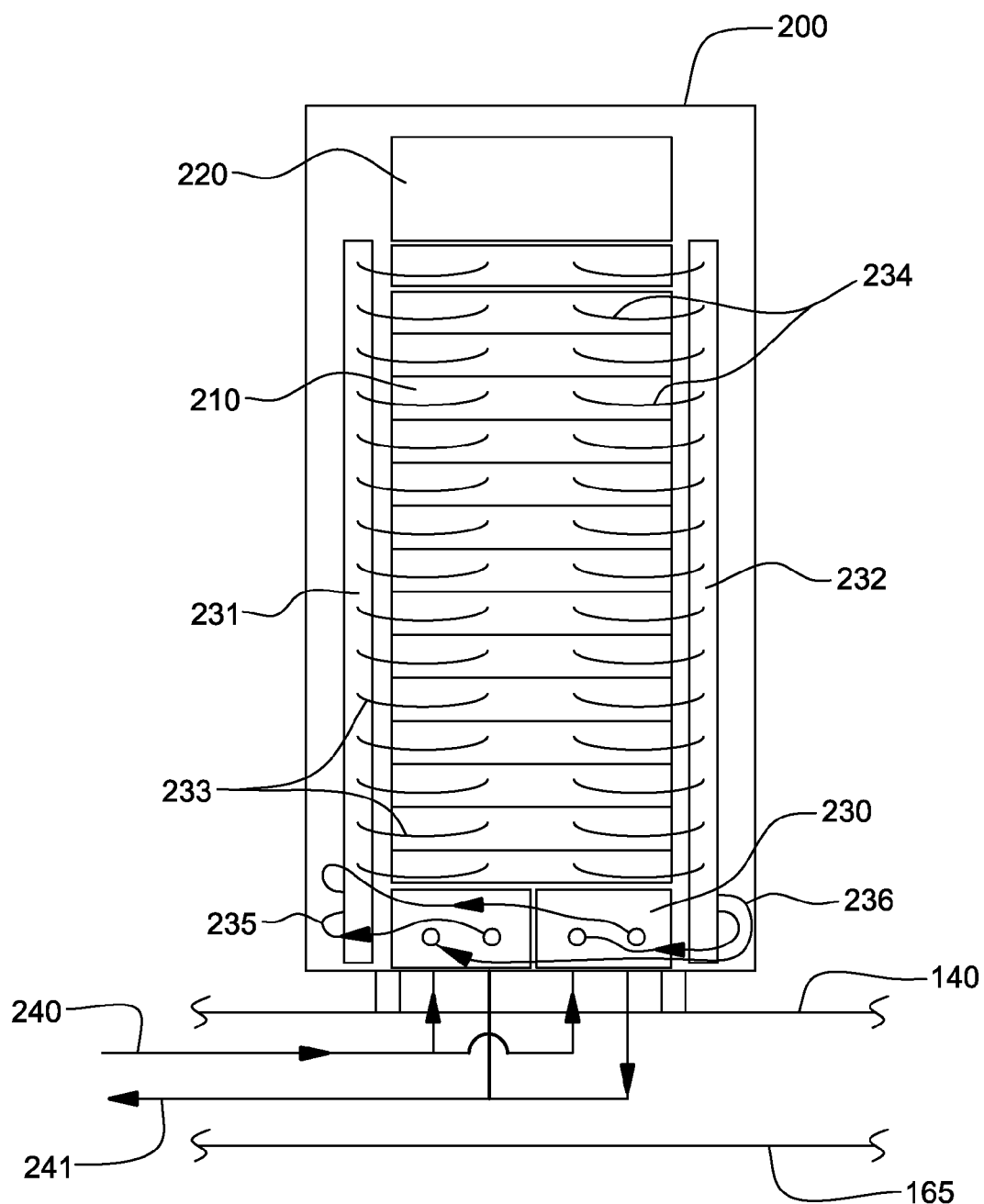
FIG. 2 is a front elevational view of one embodiment of an at least partially liquid-cooled electronics rack comprising multiple electronic systems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus depicted includes a system coolant supply manifold 231, a system coolant return manifold 232, and manifold-to-node fluid connect hoses 233 coupling system coolant supply manifold 231 to electronic systems 210 (for example, to liquid-cooled vapor condensers or liquid-cooled heat sinks (see FIGS. 6A-11) disposed within the systems) and node-to-manifold fluid connect hoses 234 coupling the individual electronic systems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems 210 is transferred from the system coolant to cooler facility coolant within the MCUs 230 provided via facility coolant supply line 240 and facility coolant return line 241 disposed, in the illustrated embodiment, in the space between raised floor 140 and base floor 165.

Figure 3:
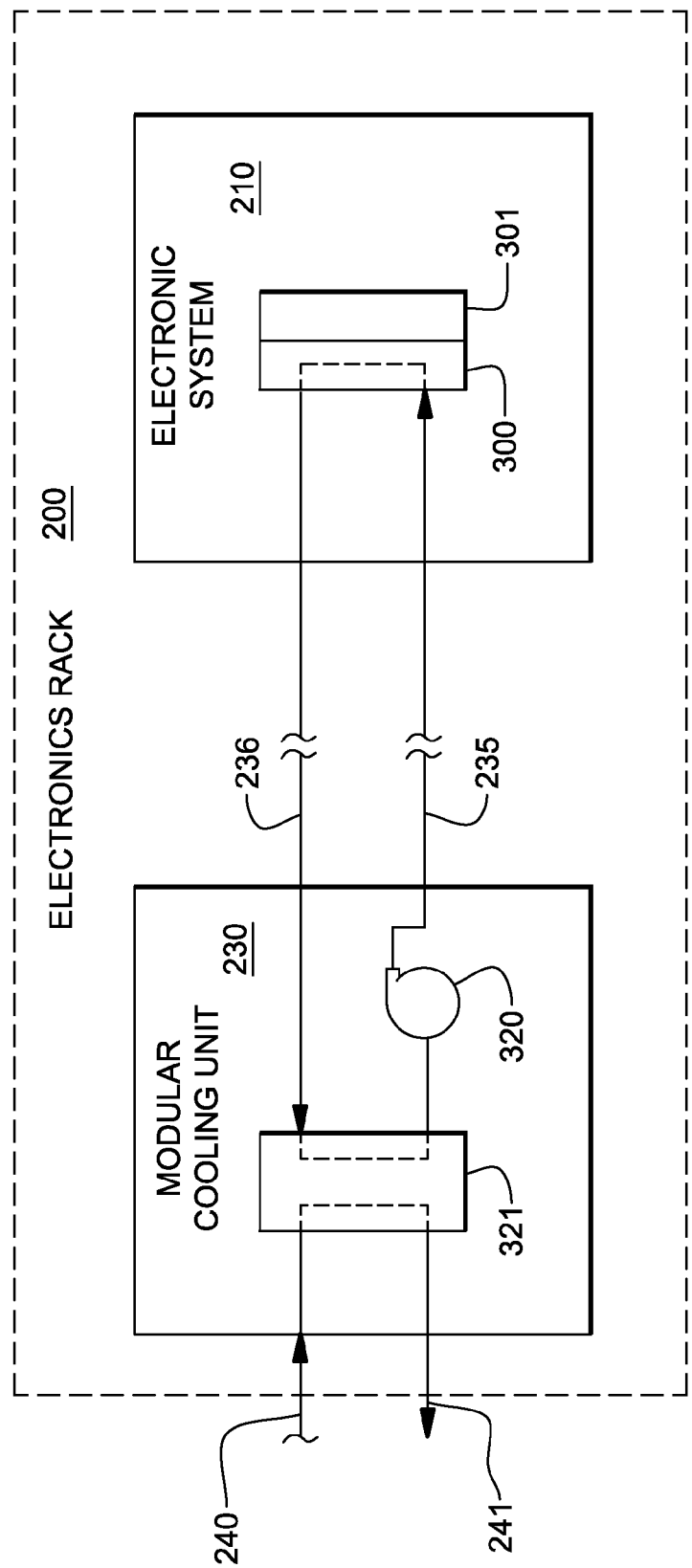
FIG. 3 is a schematic of an electronic system of an electronics rack and one approach to liquid-cooling of an electronic component with the electronic system, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 240, 241, to which heat is ultimately transferred.

Figure 4:
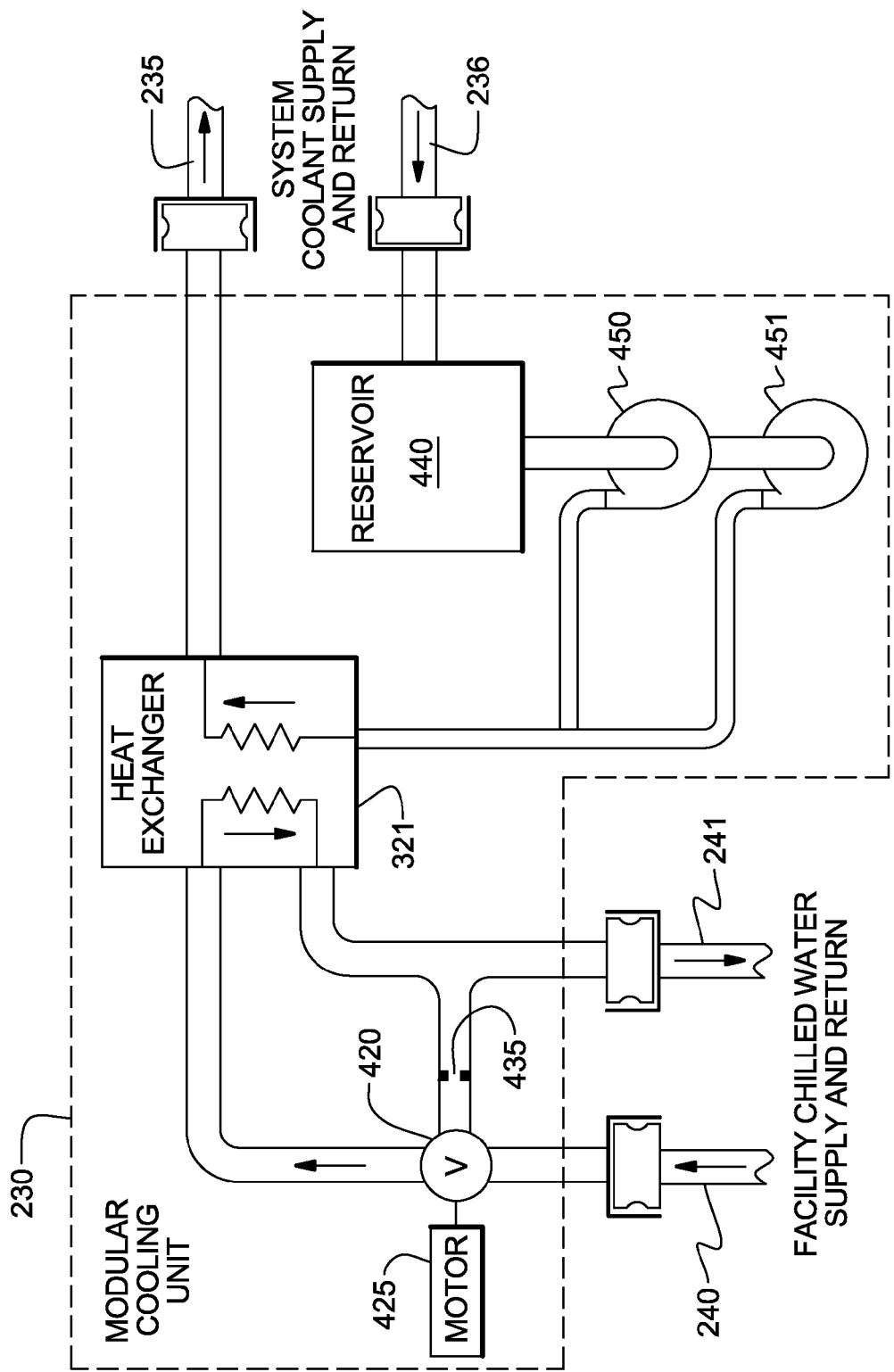
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
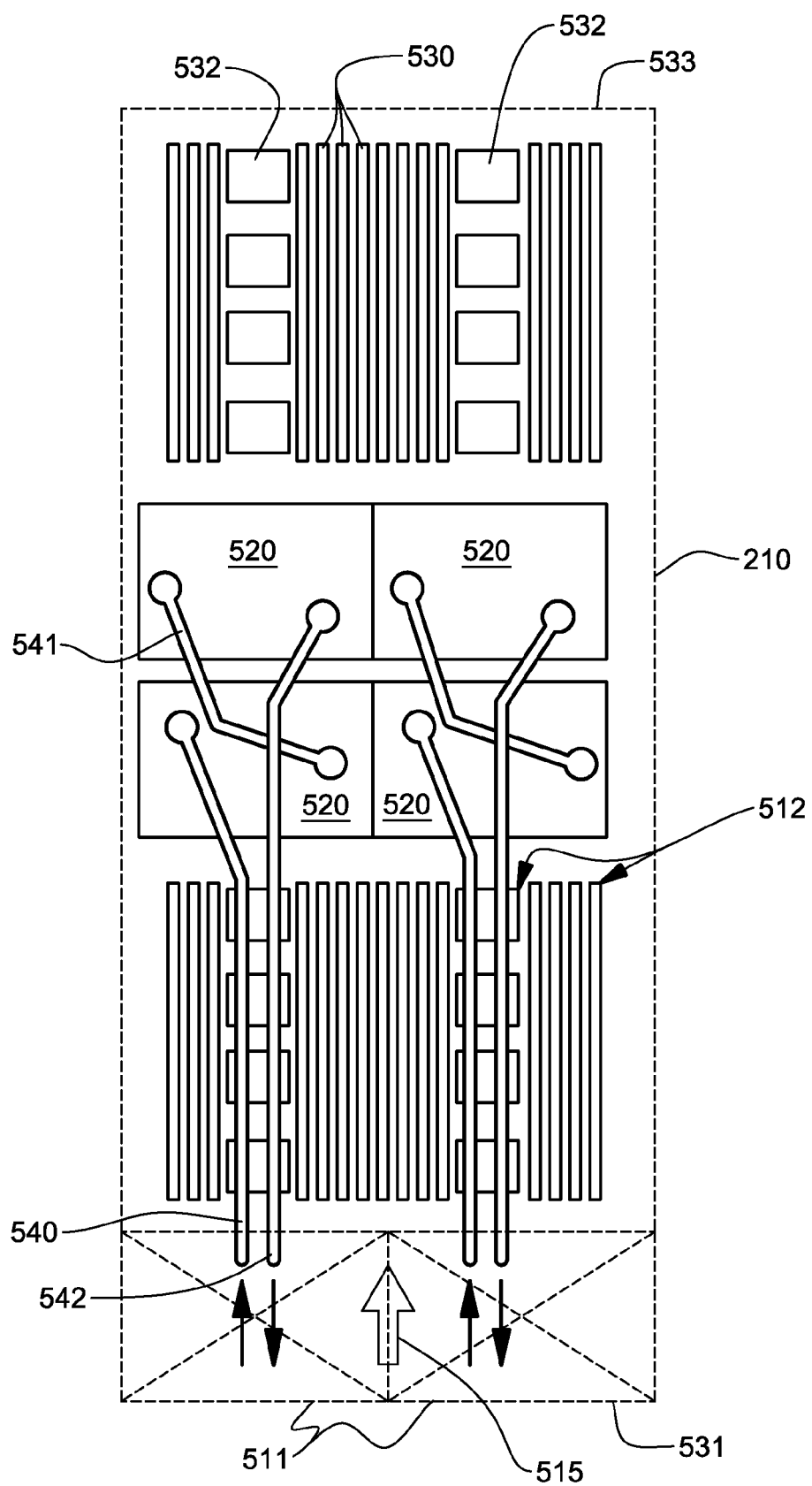
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics system.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As computing demands continue to increase, heat dissipation requirements of electronic components, such as microprocessors and memory modules, are also rising. This has motivated the development of the application of single-phase liquid-cooling solutions such as described above. Single-phase liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic system using pumped liquid, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, the components to be cooled are immersed in a dielectric fluid that dissipates heat through boiling. The vapor is then condensed by a secondary, rack-level working (or system) fluid using node or module-level, finned condensers, as explained below.

Direct immersion-cooling of electronic components of an electronic system of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water-based cooling approach. For at least these potential benefits, dielectric fluid immersion-cooling of one or more electronic systems (or portions of one or more electronic systems) of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
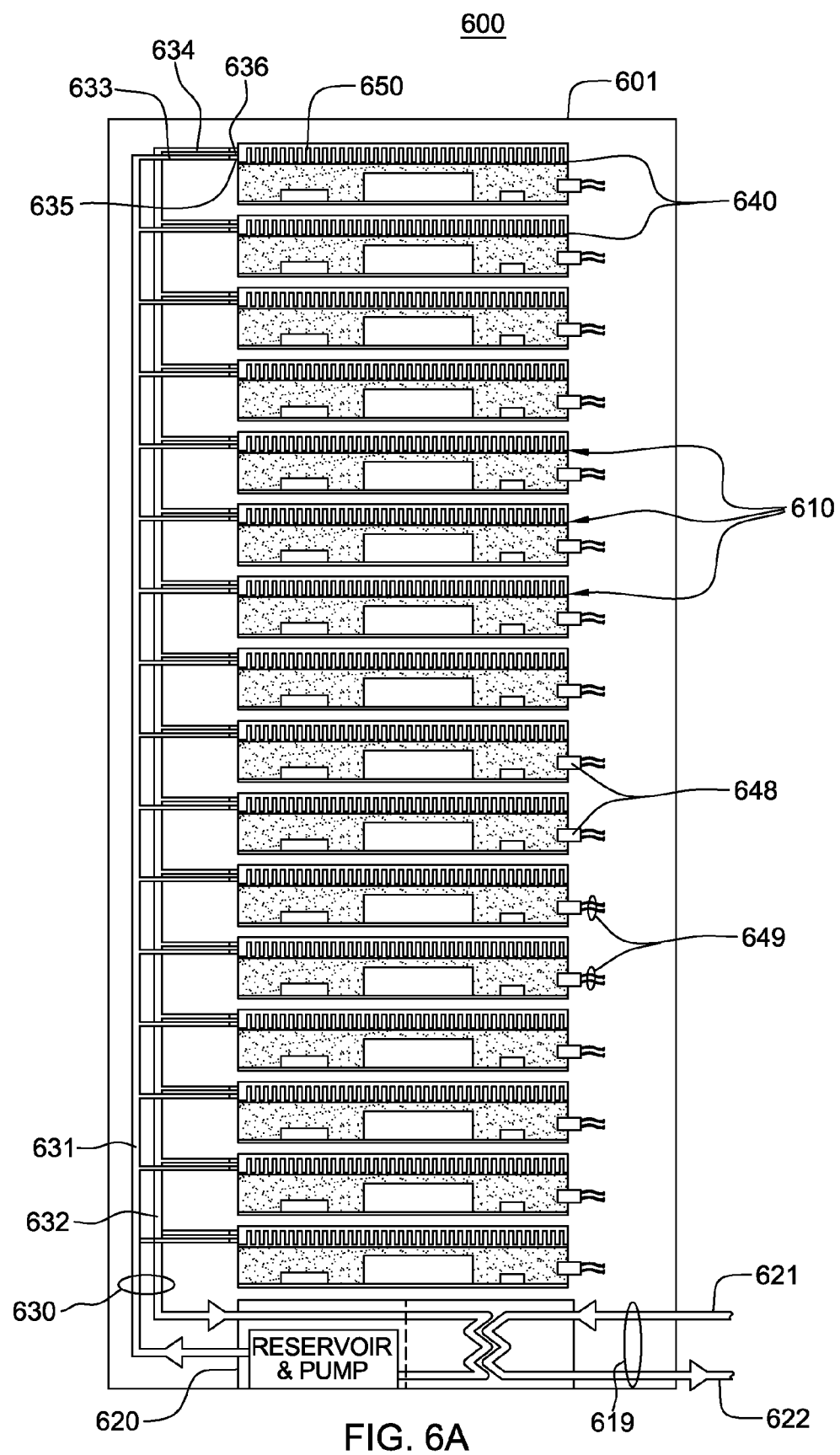
FIG. 6A is an elevational view of an alternate embodiment of a liquid-cooled electronics rack with immersion-cooling of electronic systems thereof, in accordance with one or more aspects of the present invention.

FIG. 6A is a schematic of one embodiment of a liquid-cooled electronics rack, generally denoted 600, employing immersion-cooling of electronic systems, in accordance with an aspect of the present invention. As shown, liquid-cooled electronics rack 600 includes an electronics frame 601 containing a plurality of electronic systems 610 disposed, in the illustrated embodiment, horizontally so as to be stacked within the rack. By way of example, each electronic system 610 may be a server unit of a rack-mounted plurality of server units. In addition, each electronic system includes multiple electronic components to be cooled, which in one embodiment, comprise multiple different types of electronic components having different heights and/or shapes within the electronic system.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic systems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic system 610 via the respective liquid-cooled vapor condenser 650 is transferred from the system coolant via the coolant return manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic system disposed within the sealed housing when the electronic system is operatively positioned within the sealed housing and the sealed housing is operatively positioned within the electronics rack.

Figure 6B:
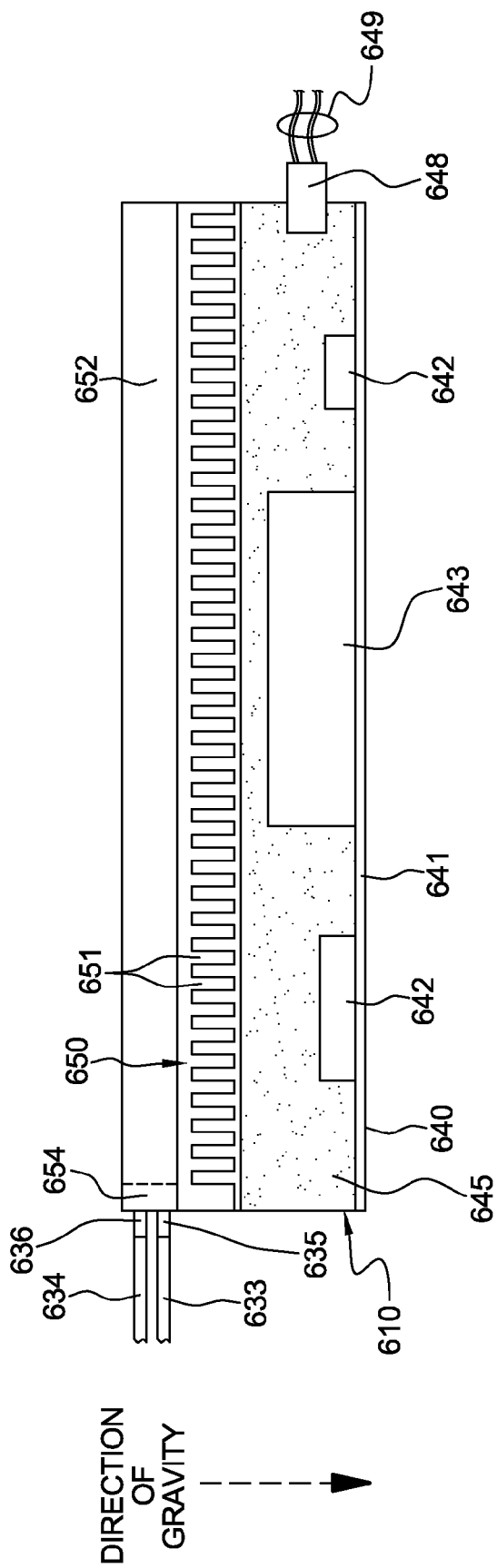
FIG. 6B is a cross-sectional elevational view of one immersion-cooled electronic system of the liquid-cooled electronics rack of FIG. 6A, in accordance with one or more aspects of the present invention.

As illustrated in FIG. 6B, electronic system 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic system with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651 extending therefrom in the upper portion of the sealed compartment. A plenum structure 654 comprises part of liquid-cooled base plate 652, and facilitates passage of system coolant through one or more channels in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cooler condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

Advantageously, in immersion-cooling such as depicted in FIGS. 6A & 6B, all of the components to be cooled are immersed in the dielectric fluid. The system fluid can tolerate a larger temperature rise, while maintaining component temperatures, thus allowing a smaller flow rate, and higher inlet temperatures, improving energy efficiency of the resultant cooling apparatus.

However, immersion-cooling of an electronic system, such as a server, may present problems with regards to servicing or replacement in the field of one or more of the components of the immersion-cooled electronic system. Servicing or replacing a component cooled via an immersion-cooled approach, such as described above in connection with FIGS. 6A & 6B, requires that the entire electronic system be drained, and that the sealed enclosure be opened to access the electronic component(s) to be serviced or replaced. This can be a time consuming and costly procedure to perform, particularly at the customer's data center.

In accordance with the cooled electronic systems presented herein, examples of which are depicted in FIGS. 7A-11, a hybrid liquid-cooling approach is disclosed, wherein the cooled electronic system includes an electronic system having one or more field-replaceable banks (or sets) of electronic components, and one or more cooling apparatuses facilitating cooling of the one or more field-replaceable banks of electronic components. Note that as used herein, a "bank" of electronic components refers to a plurality of electronic components of the same or different type arrayed in any pattern and grouped for operative insertion into or removal from an electronic system. The cooling apparatus includes an enclosure at least partially surrounding and forming a compartment about, at least in part, the electronic components of a respective field-replaceable bank of electronic components, a fluid disposed within the compartment, and a heat sink attached or affixed to or integrated with the enclosure. The field-replaceable bank of electronic components extends, in part, out through the enclosure to facilitate operative docking thereof into one or more respective receiving sockets of the electronic system. The electronic components of the field-replaceable bank of electronic components are, at least partially, immersed within the compartment in the fluid to facilitate immersion-cooling thereof, and the heat sink facilitates rejection of heat from the fluid disposed within the compartment. In one implementation, the fluid comprises a dielectric fluid, such as one or more of the above-referenced dielectric fluids.

In one embodiment, one or more thermal conductors are disposed within the compartment of the enclosure and project from one or more inner surfaces or walls of the enclosure into the compartment to facilitate transfer of heat from the fluid to the heat sink. For instance, the one or more thermal conductors may comprise one or more heat pipes. In one implementation, multiple heat pipes project from at least one inner surface of the enclosure into the compartment to facilitate transfer of heat from the fluid to the heat sink, and are interleaved within the compartment with multiple electronic components of the field-replaceable bank of electronic components. For instance, the multiple heat pipes may be in thermal communication at opposite ends thereof, with opposite, inner surfaces or walls of the enclosure to facilitate transfer of heat from the fluid within the compartment to the opposite, inner surfaces of the enclosure, and the heat sink may be a first heat sink, and the cooling apparatus include a second heat sink, with the first and second heat sinks being in thermal communication with, and disposed close or adjacent to, different inner surfaces of the opposite, inner surfaces of the enclosure. In another embodiment, the multiple heat pipes may project downwards, into the compartment from an upper, inner surface of the enclosure, and the heat sink may be a liquid-cooled heat sink including at least one coolant-carrying channel accommodating the flow of liquid coolant therethrough.

In one implementation, the heat sink may comprise a liquid-cooled heat sink having one or more coolant-carrying channels accommodating the flow of liquid coolant therethrough. Alternatively, the heat sink may be an air-cooled heat sink, with a plurality of air-cooled fins extending therefrom, and (for instance) one or more thermoelectric modules sized and positioned to facilitate transfer of heat from a respective surface or wall of the at least one inner surface or wall of the enclosure to the air-cooled heat sink. By way of specific example, the field-replaceable bank of electronic components could comprise a field-replaceable bank of dual-in-line memory modules (DIMMs).

In a further embodiment, the heat sink may be a liquid-cooled heat sink and the at least one thermal conductor may include at least one liquid-cooled thermal conductor in fluid communication with the liquid-cooled heat sink. For instance, multiple liquid-cooled thermal conductors may extend into the compartment of the enclosure, for example, interleaved within the compartment with multiple electronic components of the field-replaceable bank of electronic components, and be in fluid communication with coolant supply and return manifolds disposed (for instance) at opposite sides of the enclosure.

In further aspects described herein, the cooling apparatus may include one or more compliant layers associated with the enclosure, for instance, either as a layer within the compartment coupled to an upper, inner surface of the enclosure, and/or as the upper cover and/or base of the enclosure. The one or more compliant layers engage or are coupled to the field-replaceable bank of electronic components when the cooling apparatus is operatively positioned to facilitate cooling the field-replaceable bank of electronic components, for instance, engage a portion thereof, and thereby provide compliance to facilitate secure docking of the field-replaceable bank of electronic components into the one or more respective receiving sockets of the electronic system.

More particularly, and in one example only, the cooling apparatuses and cooling methods disclosed herein solve the issue of DIMM cooling and replaceability by providing an immersion-cooled enclosure which facilitates cooling an entire field-replaceable DIMM bank via, for instance, pool boiling of dielectric fluid within the enclosure and local vapor condensation. The cooled electronic system, comprising the electronic system with the field-replaceable bank of electronic components (e.g., DIMMs) and the cooling apparatus, is readily inserted into and removed as a single unit from, for instance, multiple DIMM-receiving sockets of the electronic system. In this manner, as one or more DIMMs within a bank of field-replaceable DIMMs fail, the immersion-cooled DIMM bank may be removed as an entire unit and replaced as a whole, with the enclosure comprising the one or more failing DIMMs being returned to, for instance, a manufacturer for individual DIMM replacement. This approach is particularly advantageous in cases where several DIMMs within a field-replaceable bank of DIMMs are allowed to fail before replacement of the entire bank is required.

By way of example, multiple DIMMs may be installed as an immersion-cooled DIMM bank, where the DIMMs are cooled by pool boiling of an encapsulated dielectric fluid. In one embodiment, the substrates or boards of the bank of DIMMs extend out from the enclosure and are configured so that they may be plugged into a set of receiving sockets (or slots) on or in, for instance, a motherboard of the electronic system. In one implementation, the bank of DIMMs extend through a lower, compliant base of the enclosure, such as a polymeric plate, which provides compliance or flexibility to facilitate insertion of the bank of DIMMs in operative position within the receiving sockets of the electronic system. In operation, vapor produced within the compartment of the enclosure is advantageously condensed locally through contact with one or more thermal conductors extending from one or more inner surfaces of the enclosure into the compartment and (in one implementation) interleaved with multiple electronic components of the DIMMs. That is, as one example, each thermal conductor is disposed between a respective pair of adjacent DIMMs. The thermally conductive surfaces of the thermal conductors may be, in one implementation, surfaces of solid thermal conductors or surfaces of heat pipes, or surfaces of hollow, liquid-filled conductors that are attached at (for instance) the upper, inner surface of the enclosure, or at one or both of two opposite, inner surfaces of the enclosure.

In one implementation, the sides of the enclosure may be fabricated of a thermally conductive material, such as a metal, and the enclosure may have integrated therewith a liquid-cooled cold plate, or may have multiple integrated, liquid-cooled cold plates. Alternatively, the heat sink could comprise an air-cooled heat sink which dissipates heat from the fluid within the compartment to air passing across the air-cooled heat sink. Heat transfer to such an air-cooled heat sink may be facilitated by one or more thermoelectric modules. The cover or upper plate of the enclosure could be made either of a compliant material, such as polymer, or a thermally conductive material, such as metal. As noted, the cover or upper plate could also be in thermal communication with a liquid-cooled cold plate, either integrated with the enclosure or separable.

In such an embodiment, the multiple thermal conductors would be in thermal communication with, for instance, the upper surface of the enclosure, rather than (or in addition to) opposing sides of the enclosure. As vapor condenses, heat released is conducted by the thermal conductors to the associated heat sink(s). In one implementation, the heat released to the thermal conductors is conducted directly to liquid flowing through hollow thermal conductors disposed within the compartment of the enclosure.

One possible approach to immersion-cooling DIMMs is to require the DIMM cooling enclosure to be sealed along the electronic system board surface, which would make field replacement of the DIMM(s) more difficult. In contrast, immersion-cooling of individual DIMMs is impractical and costly due to space limitation, and the number of DIMMs in a typical electronic system, such as a server. The cooled electronic systems and cooling apparatuses disclosed herein solve these issues by packaging the enclosure around, for instance, a set of DIMMs alone (generally referred to herein as a field-replaceable bank of electronic components), making the entire DIMM bank readily replaceable at the end-user's data center. For servicing, the bank could then be sent to, for instance, a manufacturer, where the failed DIMM(s) could be replaced, and the enclosure refilled and prepared for return to operation, resulting in minimal chance for fluid loss at the data center and improved service quality. The advantage of this approach is even greater in cases where several DIMMs in a bank are allowed to fail before a repair event is initiated, and the bank is returned to the factory for repair and/or maintenance.

Figure 7A:
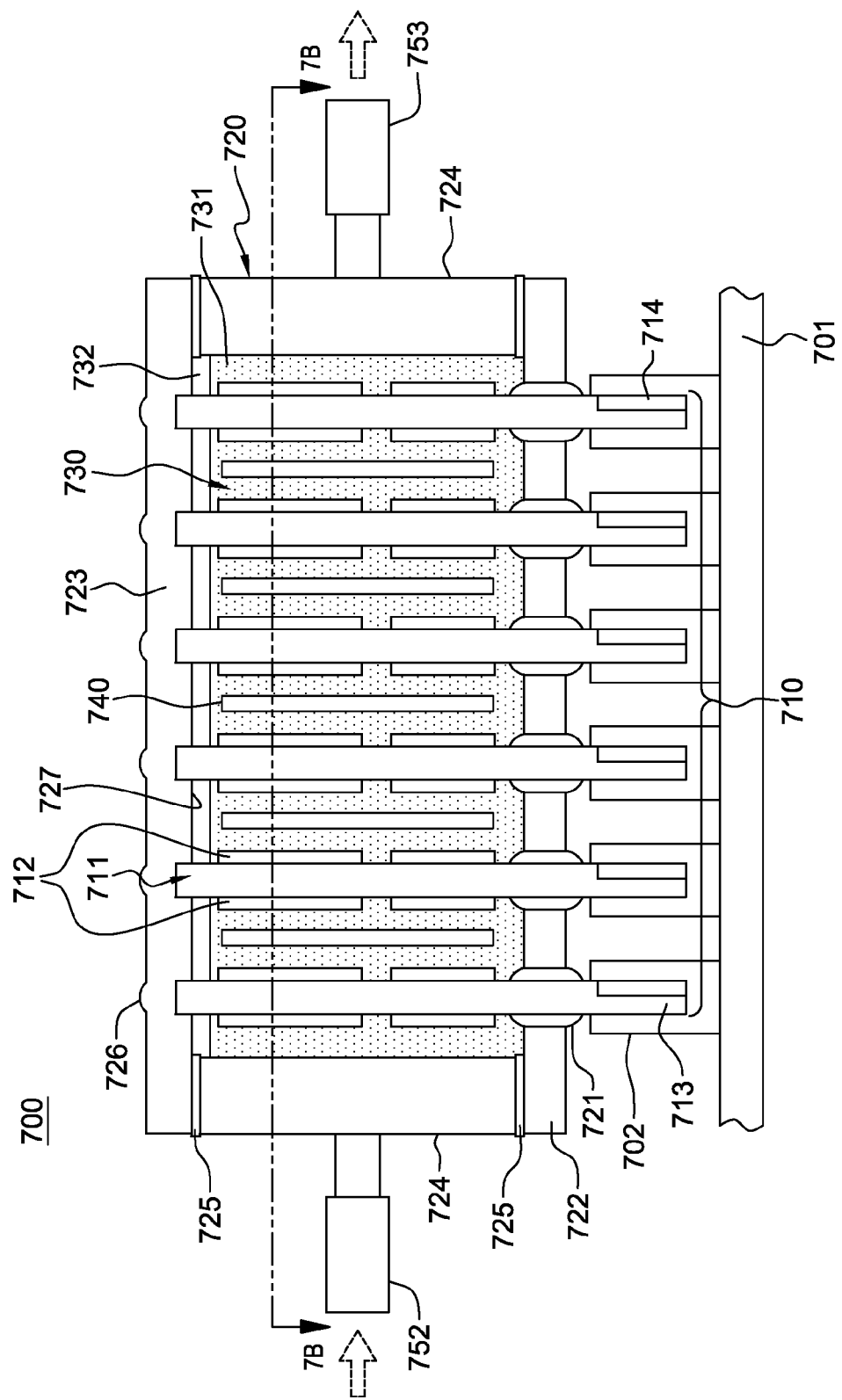
FIG. 7A is a cross-sectional elevational view of one embodiment of a cooled electronic system including a field-replaceable bank of electronic components of an electronic system and a cooling apparatus therefor, taken along line 7A-7A in the plan view thereof of FIG. 7B, in accordance with one or more aspects of the present invention.
Figure 7B:
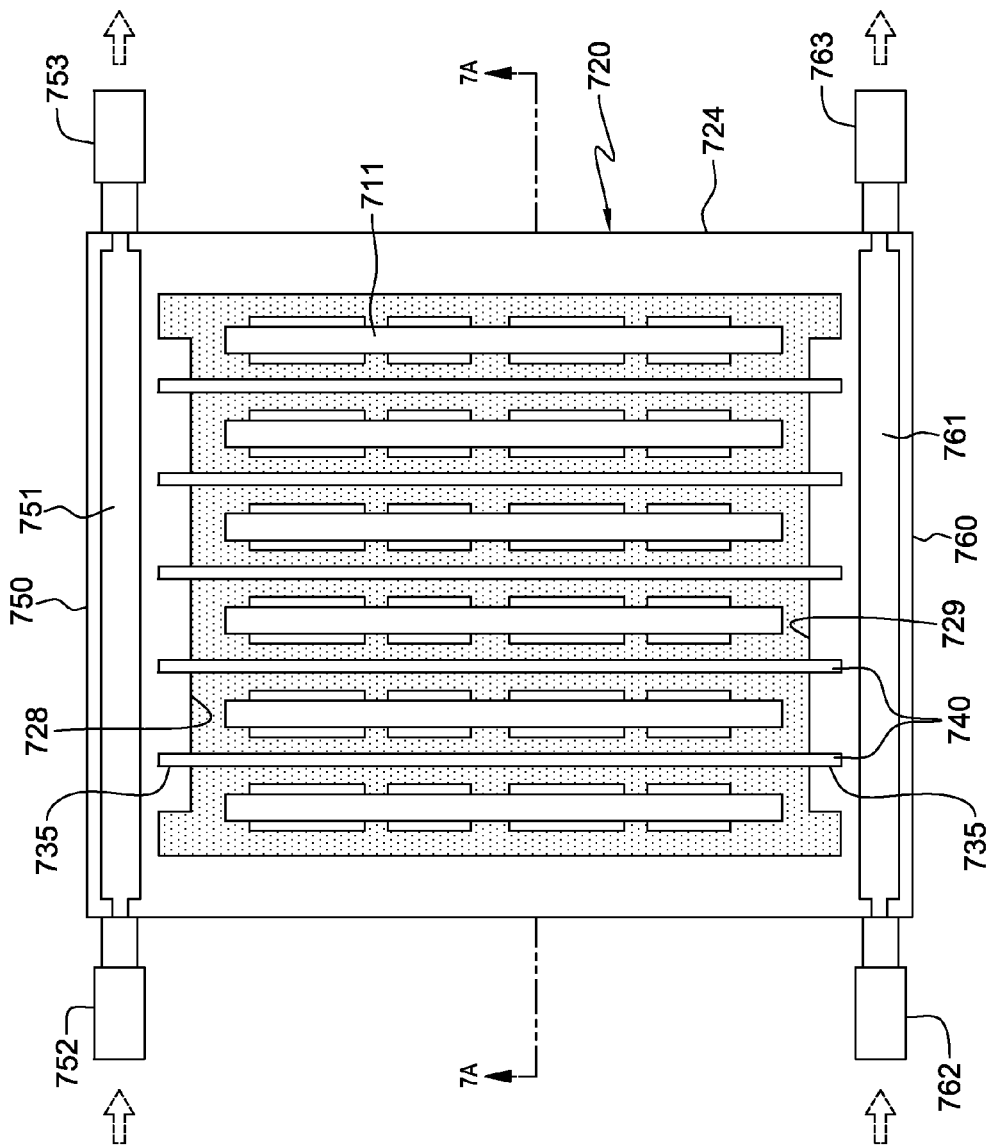
FIG. 7B is a cross-sectional plan view of the cooled electronic system of FIG. 7A, taken along line 7B-7B thereof, in accordance with one or more aspects of the present invention.

FIGS. 7A & 7B depict one example of a cooled electronic system, generally denoted 700, in accordance with one or more aspects of the present invention. Referring collectively to FIGS. 7A & 7B, cooled electronic system 700 includes an electronic system 701 with a plurality of receiving sockets 702 for operatively receiving a field-replaceable bank 710 of electronic components 711, which (in one example) may comprise a set of dual-in-line memory modules (DIMMs). Each electronic component 711 includes, in the depicted example, multiple components 712 (such as memory chips or modules) disposed on opposite main sides of a board or substrate 713. A cooling apparatus is provided for the field-replaceable bank 710 of electronic components 711, which includes an enclosure 720 that at least partially surrounds and forms a compartment 730 about, at least in part, the electronic components 712 of the bank 710 of field-replaceable components. As illustrated in FIG. 7A, the substrates 713 of electronic components 711 of the bank of field-replaceable components extend out through, in part, enclosure 720, for instance, through respective openings in a base plate 722 of enclosure 720. In one example, enclosure 720 includes base plate 722, cover plate 723, and one or more side walls 724, which may be sealed 725 together via, for instance, an adhesive or epoxy material, to form fluid-tight compartment 730.

A potting material 721 is also provided in the base plate 722 openings about the substrates 713 extending through the base plate 722 of enclosure 720. The openings in base plate 722 are appropriately sized to facilitate projection of the substrates 713 from the enclosure and thereby facilitate operative docking thereof in the respective receiving sockets 702 of electronic system 701. In one example, base plate 722 is a flexible (or compliant) material, such as a polymeric material, which provides insertion compliance for the field-replaceable bank 710 of electronic components 711. Communication and electrical connectors 714 associated with substrates 713 of the field-replaceable bank 710 of electronic components 711 facilitate operative coupling of the electronic components 711 to the electronic system 701 with docking of the bank of components into the receiving sockets 702.

Cover or upper plate 723 may also be a flexible (or compliant) plate, such as a polymeric plate, which may include grooves or notches in the inner surface 727 thereof (i.e., the surface partially defining compartment 730) that accommodate the electronic components 711, as illustrated in FIG. 7A. Nubs 726 may be provided in the upper surface of upper plate 723 aligned to the respective electronic components 711 to facilitate, for instance, asserting downward pressure on the field-replaceable bank 710 of electronic components 711 to ensure good electrical, operative coupling of the field-replaceable bank of electronic components within the respective receiving sockets 702 of electronic system 701.

As illustrated, a fluid 731 substantially fills or partially fills compartment 730, for instance, leaving a small vapor space 732 in the upper portion thereof. This fluid may comprise a dielectric fluid such as described above, which surrounds the electronic components 711 within compartment 730 of enclosure 720. In this manner, enclosure 720 is an immersion-cooling enclosure that is fully supported about, and coupled and sealed to the field-replaceable bank 710 of electronic components 711.

Referring to FIG. 7B, in one implementation, the side walls 724 of enclosure 720 are fabricated of a thermally conductive material, such as a metal, and a first heat sink 750 and a second heat sink 760 are provided integrated with (or coupled to) opposing sides of the enclosure. In the example depicted, first heat sink 750 is a first liquid-cooled heat sink, and second heat sink 760 is a second liquid-cooled heat sink, each of which includes one or more coolant-carrying channels 751, 761, respectively, which allow for the flow of liquid coolant therethrough. First liquid-cooled heat sink 750 receives liquid coolant via an inlet coupling 752 and returns liquid coolant via an outlet coupling 753. Similarly, second liquid-cooled heat sink 760 receives liquid coolant into one or more coolant-carrying channels 761 via an inlet coupling 762 and returns coolant via an outlet coupling 763. The coolant inlet and outlet couplings 752, 753, 762, 763 may each comprise, in one instance, quick connect couplings, such as the quick connect couplings referenced above. These quick connect couplings facilitate connection with, for instance, external, flexible tubing which has sufficient flexibility to facilitate insertion or removal of the field-replaceable bank of electronic components, with the cooling apparatus coupled thereto into the electronic system.

In one embodiment, the first liquid-cooled heat sink 750 is disposed adjacent to and in thermal communication with a first inner surface or wall 728 of enclosure 720, and the second liquid-cooled heat sink 760 is disposed adjacent to and in thermal communication with a second inner surface or wall 729 of enclosure 720, which in the embodiment of FIGS. 7A & 7B, are opposing, inner surfaces or walls of the enclosure. Heat is conducted through the thermally conductive sidewalls from the opposing, inner walls 728, 729 to the respective first and second liquid-cooled heat sinks 750, 760. As illustrated in FIG. 7B, the respective inner walls 728, 729 of enclosure 720 may include recesses or notches 735 sized and configured to receive therein opposite ends of thermal conductors 740. Note that the thermal conductors 740 may be, in one example, soldered into the recesses or notches 735 in the opposing, inner walls 728, 729 of enclosure 720 to facilitate good thermal conduction from the thermal conductors 740 into the opposing sidewalls, and hence to the first and second liquid-cooled heat sinks 750, 760.

In the depicted implementation, thermal conductors 740 may each comprise a solid thermally conductive material (e.g., a metal), or alternatively, may comprise heat pipes which facilitate transfer of heat from fluid 731 within compartment 730 to the first and second liquid-cooled heat sinks 750, 760 for dissipation to the auxiliary coolant, that is, the liquid coolant passing through the liquid-cooled heat sinks, which in one example, may comprise water or an aqueous-based solution. Note also that the one or more coolant-carrying channels 751, 761 through the respective liquid-cooled heat sinks 750, 760 may comprise any desired configuration, such as a single large coolant flow chamber, multiple parallel coolant flow channels, a single coolant flow channel of any desired configuration, etc.

As noted, as a specific example, the field-replaceable bank 710 of electronic components 711 may comprise a bank of DIMMs which are immersion-cooled using a cooling apparatus such as depicted in FIGS. 7A & 7B. In one embodiment, the enclosure could comprise metal on its sides, and a suitable dielectric-compatible polymer material, such as ethylene-propylene-diene monomer (EPDM) rubber, as its base and cover plates. The upper polymer plate may be made with notches into which the DIMMs can slip into, as well as nubs over the DIMMs to provide the operator with an indication of where to press down to ensure that the DIMMs are seated firmly into their respective receiving sockets of the electronic system, for instance, on a printed circuit board. The base plate may also be made of such a polymer material to allow additional flexibility during installation of the DIMMs into their sockets.

In one fabrication approach, the DIMMs are inserted into the enclosure through the openings in the base polymer plate. Once inserted, the space around the DIMMs is potted, sealing the space between the DIMMs, the electronic system circuit board, and the polymer base plate. The polymer cover and base plates may also be sealed to the metal side wall(s) using, for instance, either epoxy alone, or epoxy in combination with mechanical attachments, such as mechanical fasteners. The enclosure is partially filled with dielectric fluid, and the upper polymer plate is attached and sealed, defining the enclosure about the bank of electronic components. In one implementation, two holes may be made in the cover plate 723, and dielectric vapor forced into compartment 730 to replace the existing air. Once the air is removed, the holes may be sealed with epoxy or potting material.

In the depicted embodiment, the thermal conductors 740 are interleaved with the electronic components 711. As noted, these thermal conductors may comprise heat pipes inserted into the spaces between adjacent DIMMs. The heat pipes act as condensers to locally condense any dielectric fluid vapor formed within the compartment due to dielectric fluid boiling from one or more surfaces of electronic components 711 being cooled, or as sub-coolers to cool the fluid when not boiling. Heat released during condensation is conducted by the heat pipes (or thermal conductors) to the sides of the enclosure, and from there to the liquid-cooled heat sinks, through which water (or any suitable auxiliary coolant) flows to carry away rejected heat from the heat pipes. Rather than have two separate inlet couplings and two separate coolant outlet couplings (as shown in FIG. 7B), the inlet couplings and the outlet couplings could be separately externally joined with tubing, leaving a single coolant inlet coupling and a single coolant outlet coupling, each comprising a respective quick connect. Note that the use of quick connects facilitates field-replaceability of the bank of electronic components, allowing the assembly to be readily inserted into and removed from the liquid coolant loop associated with the electronic system within which the bank of electronic components operatively docks.

Figure 7C:
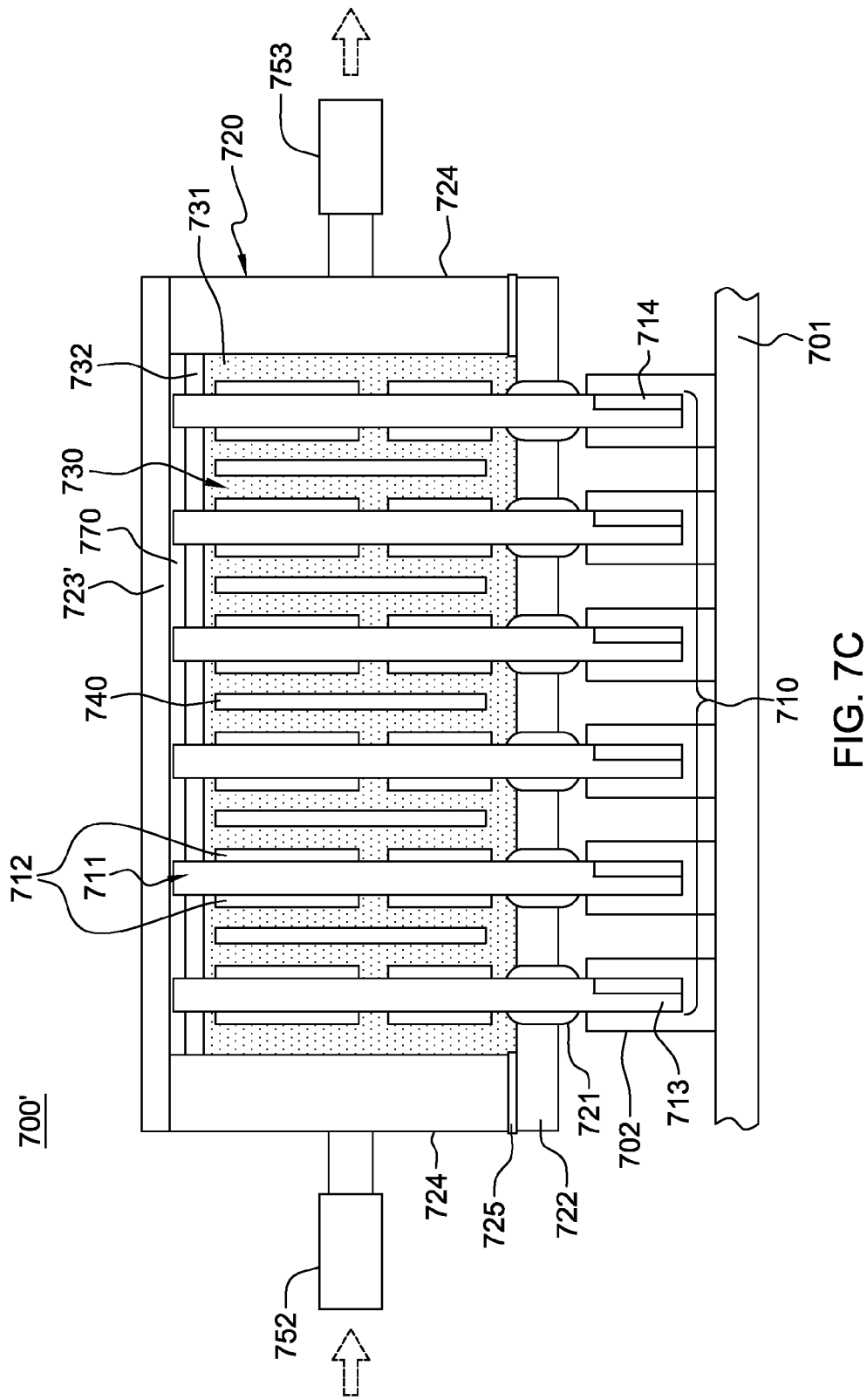
FIG. 7C is a cross-sectional elevational view of a cooled electronic system comprising a field-replaceable bank of electronic components of an electronic system and an alternate embodiment of a cooling apparatus therefor, in accordance with one or more aspects of the present invention.

FIG. 7C depicts an alternate embodiment 700' of the cooled electronic system 700 of FIGS. 7A & 7B, wherein the cover or upper plate 723' of enclosure 720 comprises a rigid plate, such as a metal plate, for additional stiffness, which allows the plate to be soldered at its edges to the metal sidewall(s) 724 of enclosure 720. In this embodiment, a flexible layer 770 of material, such as a layer of polymeric material, may be provided on the upper, inner surface of enclosure 720, between the electronic components 711 and upper plate 723' of the enclosure 720 to provide compliance to the electronic components and thereby facilitate operative docking of the field-replaceable bank 710 electronic components 711 within the respective receiving sockets 702 of the electronic system 701. Advantageously, the presence of flexible layer 770 reduces chances of damaging the electronic components 711 (e.g., DIMMs) when an external force is applied to the enclosure 720 during installation of the field-replaceable bank 710 of electronic components into the receiving sockets 702.

Figure 8:
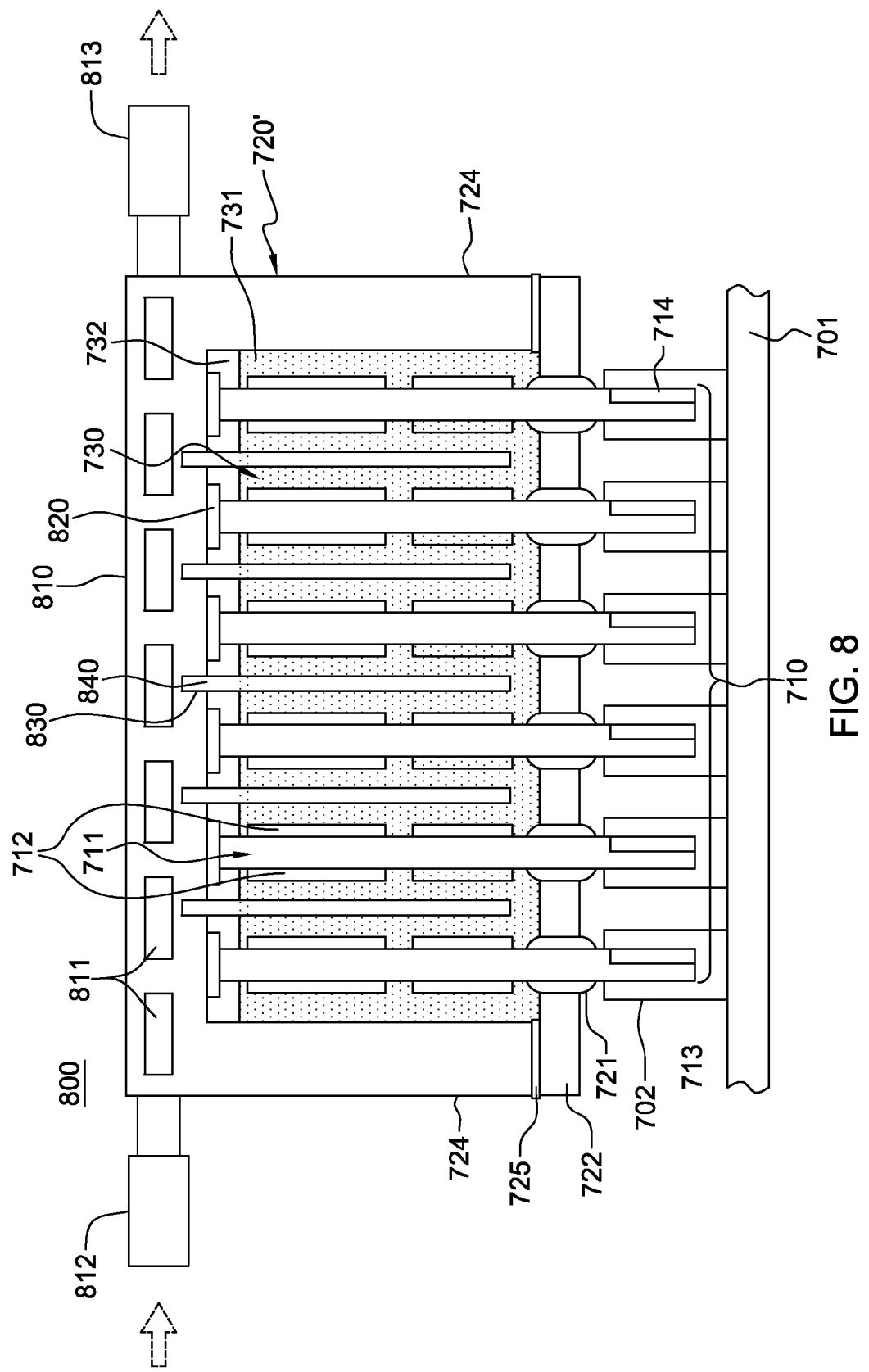
FIG. 8 is a cross-sectional elevational view of another cooled electronic system comprising a field-replaceable bank of electronic components of an electronic system and a further embodiment of a cooling apparatus therefor, in accordance with one or more aspects of the present invention.

FIG. 8 depicts a further variation, generally denoted 800, of the cooled electronic system 700 of FIGS. 7A & 7B. In cooled electronic system 800, the upper plate 723 of enclosure 720 of FIGS. 7A & 7B is replaced with a liquid-cooled heat sink 810, that is, for instance, attached to sidewalls 724 as a cover or integrated therewith as a unitary structure. Liquid-cooled heat sink 810 is fabricated of thermally conductive material and includes one or more coolant-carrying channels 811 through which the auxiliary coolant passes. Auxiliary coolant is received into liquid-cooled heat sink 810 via a coolant inlet coupling 812 and is returned via a coolant outlet coupling 813, which in one embodiment, may comprise quick connect couplings such as those described above. With liquid-cooled heat sink 810 disposed as (or as part of) the upper plate of the enclosure 720', one or more layers of compliant material 820 may be provided between the electronic components 711 and the upper, inner surface of the enclosure 720' to provide compliance to the electronic components 711 and thereby facilitate operative insertion of the field-replaceable bank 710 of electronic components 711 into the respective receiving sockets 702 of the electronic system 701. As noted above, this compliant material may comprise, by way of example, a layer of polymeric material. Notches or recesses 830 may be provided within the upper, inner surface of liquid-cooled heat sink 810 to accommodate thermal conductors 840, which as described above, extend into compartment 730 of enclosure 720', for instance, in between adjacent electronic components 711 of the field-replaceable bank 710 of electronic components 711. In this configuration, the thermal conductors 740 thus extend downward from the liquid-cooled heat sink 810 coupled to or integrated with enclosure 720'. In one implementation, the thermal conductors may be heat pipes, such as described above.

Note that the cooled electronic system 800 configuration of FIG. 8 would be advantageous in cases where the length of the enclosure 720' is constrained. In one implementation, the thermal conductors 740 (e.g., heat pipes) may be soldered to the upper liquid-cooled heat sink 810, rather than to the sidewalls 724 of the enclosure, as in the examples of FIGS. 7A-7C. The design of FIG. 8 also provides shorter thermal transfer paths from the thermal conductors 840 to the liquid-cooled heat sink 810, and potentially allows for an increase in the liquid-cooled heat sink surface area in contact with compartment 730. For example, the heat sink surface area exposed to the compartment could extend over the entire top of the enclosure. A smaller average thermal conductor to liquid-cooled heat sink heat transfer distance, and larger liquid-cooled heat sink coverage area, may result in an overall smaller conductor-to-auxiliary coolant thermal resistance compared, for instance, to the sidewall-coupled, liquid-cooled heat sink(s) designs of FIGS. 7A-7C.

Figure 9:
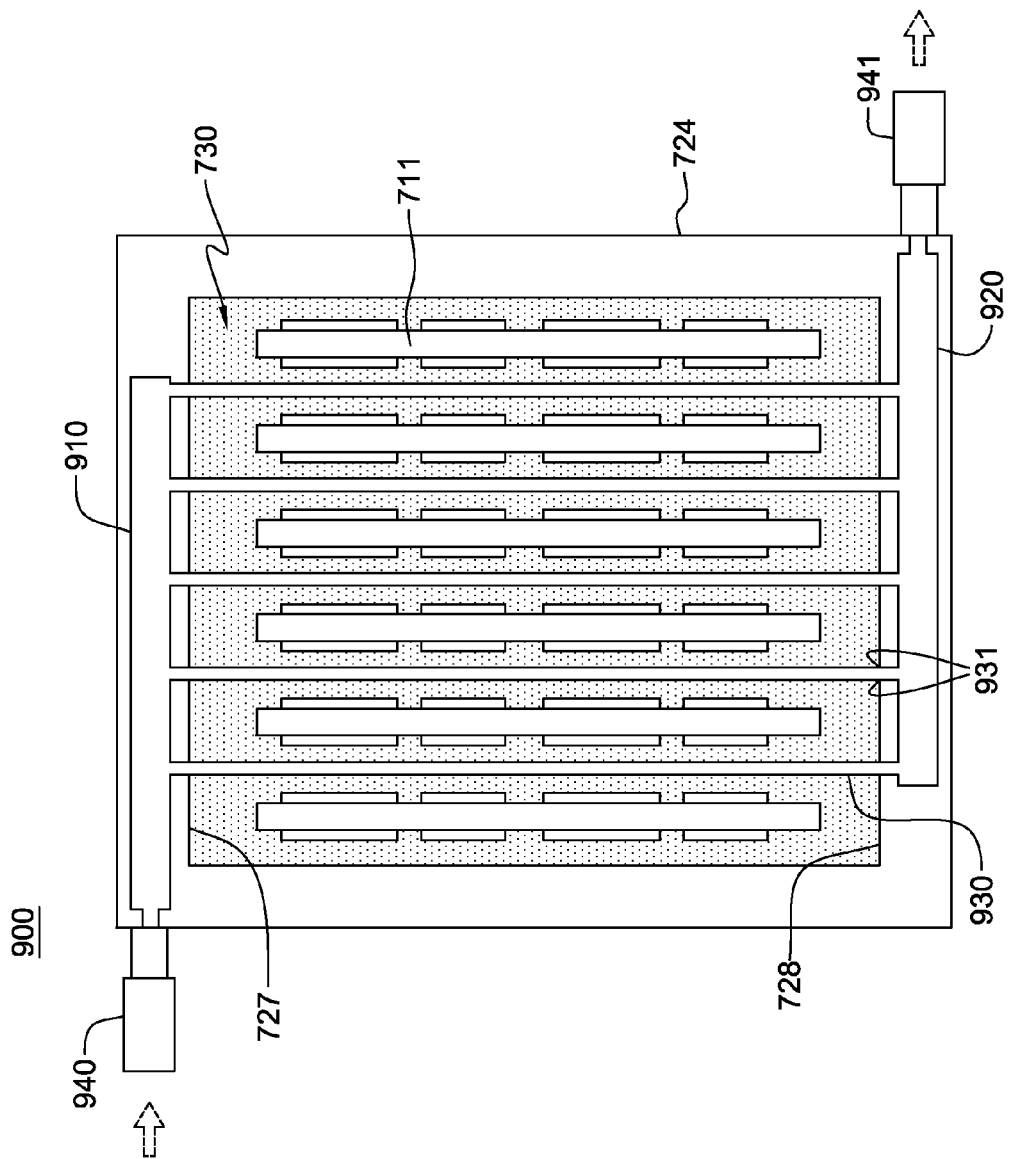
FIG. 9 is a top plan view of a further cooled electronic system including a field-replaceable bank of electronic components of an electronic system, and another embodiment of a cooling apparatus therefor, in accordance with one or more aspects of the present invention.

FIG. 9 depicts another embodiment of a cooled electronic system, generally denoted 900, in accordance with one or more aspects of the present invention. This cooled electronic system 900 is similar to cooled electronic system 700 described above in connection with FIGS. 7A & 7B, but rather than having two separate liquid-cooled heat sinks 750, 760 (see FIG. 7B) on opposing sides of the enclosure, in FIG. 9, the liquid-cooled heat sinks are configured as manifolds that are fluidically coupled via coolant-carrying thermal conductors 930, each of which comprises one or more coolant-carrying channels. The coolant-carrying thermal conductors may, in one example, be brazed at their edges 931 to the opposing enclosure walls 727, 728, and be in fluid communication with the coolant supply manifold 910 and coolant return manifold 920 at opposite sides of the enclosure. A coolant inlet coupling 940 and coolant outlet coupling 941 are provided to facilitate liquid coupling of the cooled electronic system to a coolant loop associated with the electronic system within which the field-replaceable bank of electronic components 711 is to be operatively placed. Each coupling may be a quick coupling, such as described above, and facilitate coupling the cooled electronic system 900 to, for instance, external tubing with sufficient flexibility to allow for the ready insertion and removal of the field-replaceable bank of electronic components with the cooling apparatus disposed about the electronic components as illustrated. In one example, the auxiliary coolant flowing through the coolant supply manifold 910, the one or more channels of the thermal conductors 930, and the coolant return manifold 920, is water, or an aqueous-based solution. Note that the configuration of FIG. 9 advantageously reduces the conductor-to-auxiliary coolant resistance by bringing the auxiliary coolant (e.g., condensing water) as close as possible to the thermal conductor 930 surfaces, and thereby may help to improve heat removal and condensation within the compartment 730.

FIGS. 10A & 10B depict a further variation of a cooled electronic system 1000. In this embodiment, air-cooled heat sinks 1010 are disposed at opposite sides of the enclosure 720" to facilitate rejection of heat extracted from compartment 730 to auxiliary airflow 1011 passing across the air-cooled heat sinks 1010. One or more air-moving devices (not shown) may be associated with the electronic system to facilitate, in part, airflow 1011 across the heat sink(s) 1010, and each air-cooled heat sink may comprise a plurality of parallel-extending, thermally conductive fins 1012 which project outwards from, for instance, opposite sides of enclosure 720", as illustrated in the partial view of FIG. 10B. In addition, in one implementation, one or more thermoelectric modules 1020 may be coupled between the air-cooled heat sink(s) 1010 and enclosure 720" to facilitate active transfer (i.e., electronic pumping) of heat towards the air-cooled heat sinks 1010 from the enclosure 720". The one or more thermoelectric modules 1020 are electrically coupled 1021 to, for instance, an electronics board of the electronic system, which provides power to the thermoelectric modules.

The thermoelectric modules or cooling elements operate electronically to produce a cooling effect. By passing a direct current through the legs of a thermoelectric device, a heat flow is produced across the device which may be contrary to that which would be expected from Fourier's law.

At one junction of the thermoelectric element, both holes and electrons move away, towards the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (e.g., air or water). When direct current is passed through the thermoelectric modules, a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the thermoelectric module.

By way of specific example, the thermoelectric modules 1020 may comprise TEC CP-2-127-06L modules, offered by Melcor Laird, of Cleveland, Ohio.

Note that each thermoelectric array may comprise any number of thermoelectric modules, including one or more modules, and is dependent (in part) on the size of the electronic modules, as well as the amount of heat to be transferred.

The thermoelectric (TE) array may comprise a planar thermoelectric array with modules arranged in a square or rectangular array. Although the wiring is not shown, each thermoelectric module in a column may be wired and supplied electric current (I) in series and the columns of thermoelectric modules may be electrically wired in parallel so that the total current supplied would be I×sqrt(M) for a square array comprising M thermoelectric modules, providing an appreciation of the inherent scalability of the array. In this way, if a single thermoelectric module should fail, only one column is effected, and electric current to the remaining columns may be increased to compensate for the failure.

Table 1 provides an example of the scalability provided by a planar thermoelectric heat exchanger configuration such as described herein.

TABLE 1

| Number of TE Modules (M) | Heat Exchanger Size |
| --- | --- |
| 81 | 585 mm × 585 mm (23.0 in. × 23.0 in.) |
| 100 | 650 mm × 650 mm (25.6 in. × 25.6 in.) |
| 121 | 715 mm × 715 mm (28.2 in. × 28.2 in.) |
| 144 | 780 mm × 780 mm (30.7 in. × 30.7 in.) |
| 169 | 845 mm × 845 mm (33.3 in. × 33.3 in.) |

For a fixed electric current and temperature difference across the thermoelectric modules, the heat pumped by the thermoelectric array will scale with the number of thermoelectric modules in the plan area. Thus, the heat load capability of a 650 mm×650 mm thermoelectric heat exchanger will be 1.23 times that of a 585 mm×585 mm thermoelectric heat exchanger, and that of an 845 mm×845 mm will be 2.09 times greater. Note that the size of the heat sink may need to grow to accommodate the increased heat load.

Figure 11:
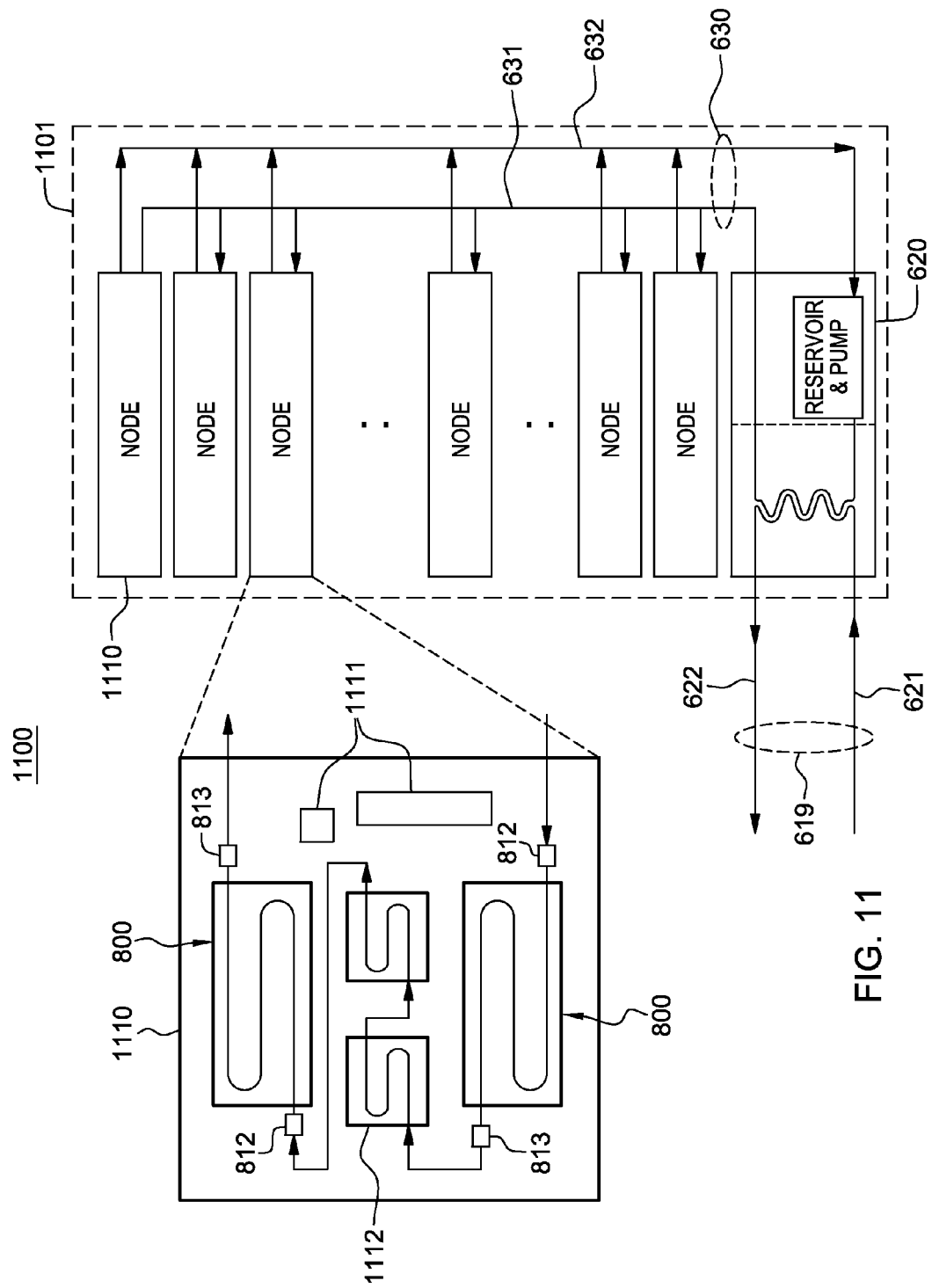
FIG. 11 is a schematic of one embodiment of a cooled electronics rack comprising one or more cooled electronic systems having one or more field-replaceable banks of electronic components and associated cooling apparatuses, in accordance with one or more aspects of the present invention.

FIG. 11 is a rack-level view of a hybrid liquid-cooled electronics rack, generally denoted 1100, employing selective immersion-cooling of certain electronic components of one or more electronic systems in the rack unit, in accordance with one or more aspects of the present invention. By way of example, the hybrid liquid-cooled electronics rack 1100 may include an electronics rack 1101 with a plurality of electronic systems 1110 disposed, in the illustrated embodiment, horizontally so as to be stacked within the rack. As one example, each electronic system 1110 may be a server unit of a rack-mounted plurality of server units. In addition, the electronic systems include multiple electronic components to be cooled, which (in one embodiment) comprise multiple different types of electronic components having different cooling requirements. For instance, one or more cooled electronic systems 800 may be provided comprising field-replaceable banks of immersion-cooled electronic components, such as described above in connection with the embodiment of FIG. 8, while other components, such as one or more processor modules may have liquid-cooled plates or immersion-cooled enclosures 1112 coupled thereto, and multiple other components 1111 may be air-cooled only via, for instance, an inlet-to-outlet airflow through electronics rack 1101, provided by one or more air-moving devices (not shown).

The cooling apparatus of FIG. 11 is shown to include one or more modular cooling units (MCUs) 620 disposed, by way of example, in a lower portion of electronics rack 1101. Each modular cooling unit 620 may be similar to the modular cooling unit described above in connection with FIGS. 4, 6A & 6B, and include, for example, a liquid-to-liquid heat exchanger for extracting heat from coolant flowing through the auxiliary (e.g., system) coolant loop 630 of the cooling apparatus and dissipating heat within, for instance, a facility coolant loop 619, comprising a facility coolant supply line 621 and a facility coolant return line 622. As one example, facility coolant supply and return lines 621, 622 couple modular coolant unit 620 to a data center facility coolant supply and return (not shown). Modular cooling unit 620 further includes an appropriately sized reservoir, pump, and optional filter for moving liquid-coolant under pressure through auxiliary or system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated, rigid tube vertically mounted to the electronics rack 1101, or to a door of the electronics rack.

In the embodiment illustrated, the coolant supply and return manifold are in fluid communication with respective coolant inlet and coolant outlet couplings 812, 813 of multiple electronic systems 1110 within the rack. By way of example only, a single pass of coolant within electronic system 1110 may be provided. As noted above, fluidic coupling between the electronic systems and coolant manifolds, as well as within the electronic systems between the cooled electronic systems comprising the field-replaceable banks of electronic components and the node-level coolant loop of the electronic system, can be via suitable quick connect couplers.

In the specific example of FIG. 11, electronic system 1110 comprises a server with four immersion-cooled subsystems including, for instance, two cooled electronic systems 800, comprising field-replaceable banks of DIMMs, and two other components, such as processors which are immersion-cooled via separate enclosures 1112. In this example, only the field-replaceable banks of DIMMs are readily removable by disconnecting the respective quick connects 812, 813 and removing the field-replaceable banks from the electronic system 1110. Water, or any other suitable auxiliary coolant, may be circulated at the rack level. As the coolant flows from one immersion-cooled enclosure to another, heat is discharged to the coolant, and the warm coolant is then exhausted from the electronic systems for return to the modular cooling unit 620, where it is cooled via heat exchange with the chilled facility coolant, and then pumped back to the electronic systems.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooled electronic system comprising:
    an electronic system comprising a field-replaceable bank of electronic components, the electronic components of the field-replaceable bank of electronic components comprising multiple substrates with components mounted thereto; and
    a cooling apparatus facilitating cooling of the field-replaceable bank of electronic components, the cooling apparatus comprising:
        an enclosure at least partially surrounding and forming a compartment about, at least in part, the electronic components of the field-replaceable bank of electronic components, and the substrates of the electronic components of the field-replaceable bank of electronic components extending, in part, through respective openings in the enclosure and operatively docking into respective receiving sockets of the electronic system external to the enclosure;
        a fluid disposed within the compartment, the electronic components of the field-replaceable bank of electronic components being, at least partially, immersed within the compartment in the fluid to facilitate immersion-cooling thereof; and
        a heat sink attached to or integrated with the enclosure, the heat sink facilitating rejection of heat from the fluid disposed within the compartment.

2. The cooled electronic system of claim 1, further comprising at least one thermal conductor, the at least one thermal conductor being disposed within the compartment of the enclosure and projecting from at least one inner surface of the enclosure into the compartment to facilitate transfer of heat from the fluid to the heat sink.

3. The cooled electronic system of claim 2, wherein the at least one thermal conductor comprises at least one heat pipe, the at least one heat pipe facilitating transfer of heat from the fluid within the compartment to the heat sink attached to or integrated with the enclosure.

4. The cooled electronic system of claim 3, further comprising multiple heat pipes projecting from the at least one inner surface of the enclosure into the compartment and interleaved within the compartment with multiple electronic components of the field-replaceable bank of electronic components.

5. The cooled electronic system of claim 4, wherein the multiple heat pipes are in thermal communication at opposite ends thereof, with opposite, inner surfaces of the enclosure to facilitate transfer of heat from the fluid within the compartment to the opposite, inner surfaces of the enclosure.

6. The cooled electronic system of claim 5, wherein the heat sink is a first heat sink and the cooling apparatus further comprises a second heat sink, the first heat sink and the second heat sink each being in thermal communication with, and disposed adjacent to, a different inner surface of the opposite, inner surfaces of the enclosure.

7. The cooled electronic system of claim 4, wherein the heat sink comprises a liquid-cooled heat sink comprising at least one coolant-carrying channel accommodating the flow of liquid coolant therethrough.

8. The cooled electronic system of claim 4, wherein the heat sink comprises an air-cooled heat sink with a plurality of air-cooled fins extending therefrom, and at least one thermoelectric module sized and positioned to facilitate transfer of heat from a respective inner surface of the at least one inner surface of the enclosure to the air-cooled heat sink.

9. The cooled electronic system of claim 4, wherein the field-replaceable bank of electronic components comprises a field-replaceable bank of dual-in-line memory modules.

10. The cooled electronic system of claim 4, wherein the multiple heat pipes project downward, into the compartment from an upper, inner surface of the enclosure, and the heat sink comprises a liquid-cooled heat sink comprising at least one coolant-carrying channel accommodating the flow of liquid coolant therethrough.

11. The cooled electronic system of claim 2, wherein the heat sink comprises a liquid-cooled heat sink and the at least one thermal conductor comprises at least one liquid-cooled thermal conductor in fluid communication with the liquid-cooled heat sink.

12. The cooled electronic system of claim 11, further comprising multiple liquid-cooled thermal conductors extending into the compartment of the enclosure and interleaved within the compartment with multiple electronic components of the field-replaceable bank of electronic components.

13. The cooled electronic system of claim 1, wherein the cooling apparatus further comprises at least one compliant layer associated with the enclosure and coupled to the field-replaceable bank of electronic components, the at least one compliant layer providing compliance to facilitate secure docking of the field-replaceable bank of electronic components into the one or more respective receiving sockets of the electronic system.

14. A cooled electronics rack comprising:
an electronics rack comprising at least one electronic system, the at least one electronic system comprising a field-replaceable bank of electronic components, and the electronic components of the field-replaceable bank of electronic components comprising multiple substrates with components mounted thereto; and
a cooling apparatus facilitating cooling of the field-replaceable bank of electronic components the cooling apparatus comprising:
an enclosure at least partially surrounding and forming a compartment about, at least in part, the electronic components of the field-replaceable bank of electronic components, the substrates of the electronic components of the field-replaceable bank of electronic components extending, in part, through respective openings in the enclosure and operatively docking into respective sockets of the at least one electronic system external to the enclosure;
a fluid disposed within the compartment, the electronic components of the field-replaceable bank of electronic components being, at least partially, immersed within the compartment in the fluid to facilitate immersion cooling thereof; and
a heat sink attached to or integrated with the enclosure, the heat sink facilitating rejection of heat from the fluid disposed within the compartment.

15. The cooled electronics rack of claim 14, further comprising multiple thermal conductors, the multiple thermal conductors being disposed within the compartment of the enclosure and projecting from at least one inner surface of the enclosure into the compartment to facilitate transfer of heat form the fluid to the heat sink, the multiple thermal conductors being interleaved within the compartment with multiple electronic components of the field-replaceable bank of electronic components.

16. The cooled electronics rack of claim 15, wherein the multiple thermal conductors are in thermal communication at opposite ends thereof, with opposite, inner surfaces of the enclosure to facilitate transfer of heat from the fluid within the compartment to the opposite, inner surfaces of the enclosure, and wherein the heat sink is a first heat sink, and the cooling apparatus further comprises a second heat sink, the first heat sink and the second heat sink each being in thermal communication with, and disposed adjacent to, a different inner surface of the opposite, inner surfaces of the enclosure.

17. The cooled electronics rack of claim 14, wherein the cooling apparatus further comprises at least one compliant layer associated with the enclosure and coupled to the field-replaceable bank of electronic components, the at least one compliant layer providing compliance to facilitate secure docking of the field-replaceable bank of electronic components into the one or more respective receiving sockets of the electronic system.

\* \* \* \* \*